(12) United States Patent
Ohsaka

(10) Patent No.: US 7,594,105 B2
(45) Date of Patent: Sep. 22, 2009

(54) MULTILAYER PRINT CIRCUIT BOARD

(75) Inventor: Tohru Ohsaka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 491 days.

(21) Appl. No.: 11/566,942

(22) Filed: Dec. 5, 2006

(65) Prior Publication Data
US 2007/0136618 A1 Jun. 14, 2007

(30) Foreign Application Priority Data
Dec. 12, 2005 (JP) .............. 2005-358161

(51) Int. Cl.
*H05K 7/08* (2006.01)
*H01P 5/02* (2006.01)
(52) U.S. Cl. .............. 713/2; 333/32; 333/33; 333/17.3; 333/263; 361/765; 361/780; 361/782; 29/825; 29/830; 29/852
(58) Field of Classification Search ........ 713/2; 333/32, 33, 17.3, 263; 361/765, 780, 782; 29/825, 830, 852
See application file for complete search history.

(56) References Cited
U.S. PATENT DOCUMENTS 4,054,939 A * 10/1977 Ammon .................. 361/792
4,636,919 A * 1/1987 Itakura et al. ............. 361/794
7,052,288 B1 * 5/2006 Minich ...................... 439/78
7,168,164 B2 * 1/2007 Jessep et al. ............... 29/852
7,271,349 B2 * 9/2007 Jessep et al. .............. 174/262
7,271,681 B2 * 9/2007 Dyckman et al. ........... 333/33
7,466,560 B2 * 12/2008 Hayashi et al. ............ 361/784
2006/0050491 A1 3/2006 Hayashi et al.
2007/0008049 A1 * 1/2007 Dyckman et al. ........... 333/33
2009/0090465 A1 * 4/2009 Vasoya ..................... 156/280

FOREIGN PATENT DOCUMENTS
JP H09-139573 5/1997

* cited by examiner

*Primary Examiner*—Abdelmoniem Elamin
(74) *Attorney, Agent, or Firm*—Fitzpatrick, Cella, Harper & Scinto

(57) ABSTRACT

This invention effectively prevents potential fluctuation in the power supply terminal of a semiconductor device, that is, noise from flowing out to a main power supply wiring. A multilayer print circuit board includes a first power supply via hole which connects to the power supply terminal of a semiconductor integrated circuit on a first surface layer and extends from the first surface layer to a second surface layer, a ground via hole which connects to a ground conductive layer, extends from the ground conductive layer to the second surface layer, and connects to the first power supply via hole on the second surface layer through a bypass capacitor, a first clearance hole which is formed in a power supply conductive layer, and a second clearance hole which is formed in the ground conductive layer. The first clearance hole is larger than the second clearance hole.

9 Claims, 19 Drawing Sheets

MULTILAYER PRINT CIRCUIT BOARD

BACKGROUND OF THE INVENTION

1. Field of the Invention

The present invention relates to a technique to reduce noise in a print circuit board mounted with a semiconductor integrated circuit (IC/LSI).

2. Description of the Related Art

As the speed and frequency of a semiconductor integrated circuit (IC/LSI) increase, EMI (Electro Magnetic Interference) as the unwanted radiation of the electro magnetic wave has become an issue. Various factors can cause EMI. Noise generated by the power supply terminal of the IC/LSI is one major factor.

Conventionally, a bypass capacitor is provided to decrease the noise generated by the power supply terminal of the IC/LSI. The bypass capacitor stably supplies power to the IC and simultaneously prevents potential fluctuation at the power supply terminal of the IC, that is, outflow of the noise to the main power supply wiring. This is based on the operation (decoupling) that the noise of the power supply terminal returns to ground through the bypass capacitor. Noise outflow to the main power supply wiring adversely affects a print circuit board over a wide range to induce degradation of EMI. Insertion of the bypass capacitor prevents noise outflow.

As a measure to enhance the noise decoupling effect of the bypass capacitor, a method of providing a chip inductor is arranged to enhance the decoupling effect of the bypass capacitor. As shown in FIG. 2, a component (inductor 1) which increases the impedance is provided to a bypass capacitor 3 on a main power supply wiring 2 side to decrease the impedance of the bypass capacitor 3 relatively, thus enhancing the decoupling effect.

FIG. 3 shows the flow of noise 4 of the circuit in FIG. 2. FIG. 3 shows how the inductor 1 prevents outflow of the noise to the main power supply side.

Based on the same idea as described above, Japanese Patent Laid-Open No. 9-139573 discloses a method of increasing the impedance of the main power supply wiring by considering the arrangement of the wiring.

Recently, however, the conventional method of inserting the inductance cannot often decouple the noise, and the noise often flows out to the main power supply.

The following description can explain this phenomenon.

In recent years, the IC/LSI package size increases. A narrow-pitch, multi-pin QFP and an area grid array represented by a BGA are employed often. Downsizing of electronic devices also progresses. Along with this trend, the component mounting surface of a print circuit board where a bypass capacitor is to be mounted is often the back surface of the surface where an IC/LSI is to be mounted. In this case, the print circuit board must have a via hole to connect the power supply terminal of the IC/LSI to the bypass capacitor.

In a multilayer print circuit board having four or more layers, the via hole is formed to extend through a main power supply conductive layer and ground conductive layer as inner layers. To prevent short-circuiting between the via hole and the ground conductive layer as the inner layer, a portion where no conductor is present, i.e., a clearance hole, is formed concentrically around the via hole in the ground conductive layer.

FIG. 4 is a perspective view schematically showing the respective layers of a print circuit board, and FIG. 5 is a plan view of the respective layers.

Referring to FIGS. 4 and 5, reference numeral 3 denotes a bypass capacitor; 5, a semiconductor device such as an IC or LSI; 6, a main power supply layer; 7, a ground layer; 8, a first power supply via hole; 9, a second power supply via hole; 10, a ground via hole; 12, a first surface layer; and 13, a second surface layer. Reference numerals 18 denote connecting portions which connect via holes to inner-layer conductors, respectively; and 22, clearance holes where no conductors are present to prevent the via holes and the inner-layer conductors from respectively coming into contact with each other.

In order to maintain the electrical path to the bypass capacitor 3 and prevent noise outflow to the main power supply layer 6, the main power supply layer 6 also has the clearance hole 22 around the first power supply via hole 8. In general, the clearance hole 22 has a minimal manufacturable size. This undesirably causes capacitive coupling between the power supply via hole 8 and main power supply layer 6, and a noise current may flow out to the main power supply layer 6 before it reaches the bypass capacitor 3. As a result, the decoupling effect of the bypass capacitor 3 degrades.

FIG. 6 shows a circuit which employs a capacitive coupling 11 by means of the clearance hole 22, and FIG. 7 shows the flow of the noise 4. FIG. 8 also shows the flow of the noise 4 in the perspective view of FIG. 4.

It can be understood that the capacitive coupling 11 between the clearance hole 22 and main power supply layer 6 causes noise outflow to the main power supply layer 6. This phenomenon occurs between the power supply terminal of the IC 5 and the bypass capacitor 3. Even insertion of an inductor 1 to the main power supply side according to the prior art described above cannot solve this phenomenon.

SUMMARY OF THE INVENTION

The present invention has been made in view of the problem described above, and has as its object to effectively prevent potential fluctuation in the power supply terminal of the semiconductor device, that is, noise outflow to the main power supply wiring.

In order to solve the above problem and achieve the above object, according to the present invention, there is provided a multilayer print circuit board in which a semiconductor integrated circuit is mounted on a first surface layer and a bypass capacitor is mounted on a second surface layer on a side opposite to the first surface layer, and which has a power supply conductive layer and a ground conductive layer therein, comprising a first power supply via hole which connects to a power supply terminal of the semiconductor integrated circuit on the first surface layer and extends from the first surface layer to the second surface layer; a power supply wiring which connects to the first power supply via hole on the second surface layer; a ground via hole which connects to the ground conductive layer, extends from the ground conductive layer to the second surface layer, and connects to the power supply wiring on the second surface layer through the bypass capacitor; a first clearance hole which is formed without any conductor around a portion of the power supply conductive layer where the first power supply via hole extends so the first power supply via hole and the power supply conductive layer do not come into contact with each other; and a second clearance hole which is formed without any conductor around a portion of the ground conductive layer where the first power supply via hole extends so the first power supply via hole and the ground conductive layer do not come into contact with each other, wherein the first clearance hole is larger than the second clearance hole.

Further features of the present invention will become apparent from the following description of exemplary embodiments with reference to the attached drawings.

DESCRIPTION OF THE EMBODIMENTS

The preferred embodiments of the present invention will be described in detail with reference to the accompanying drawings.

First Embodiment

Figure 1:
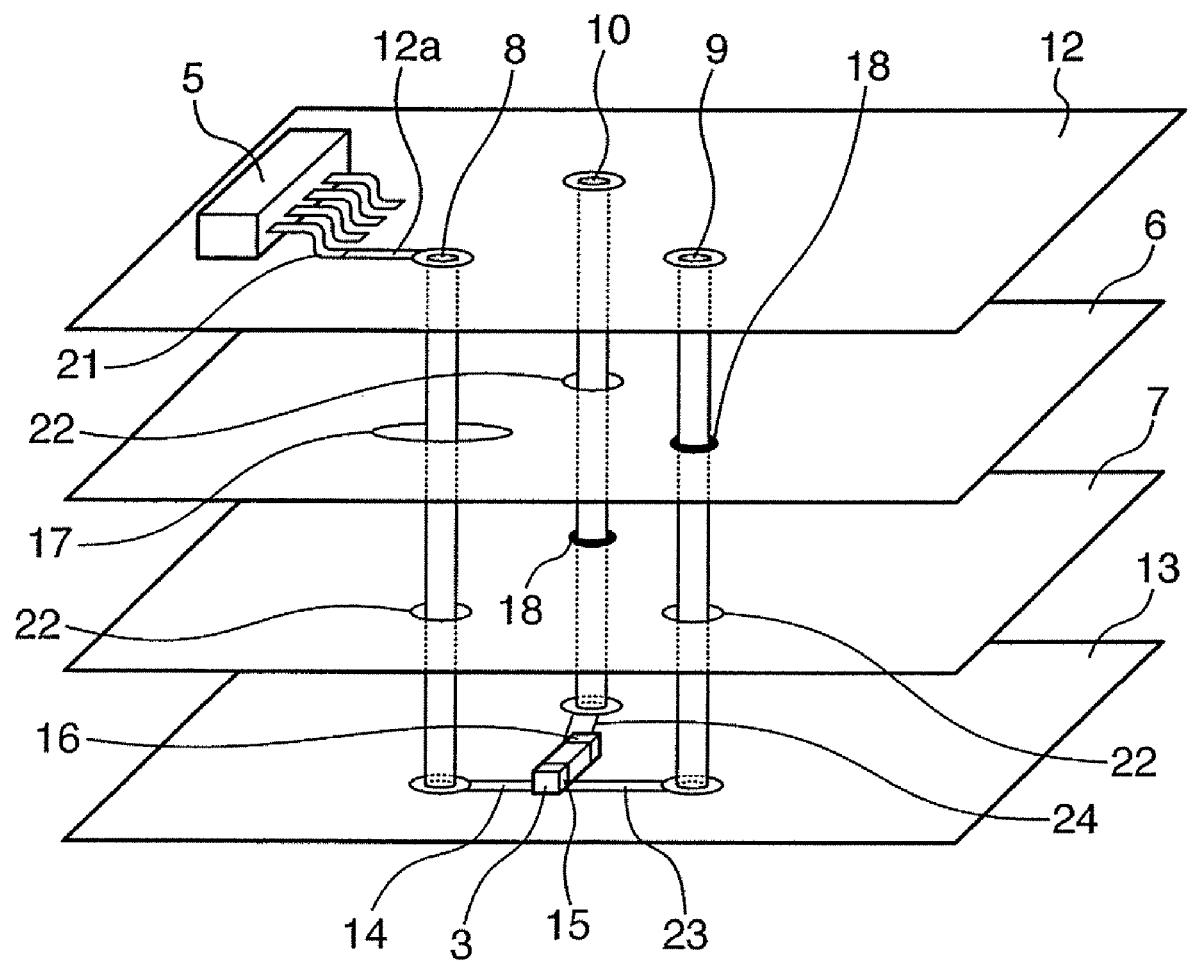
FIG. 1 is a perspective view schematically showing a multilayer print circuit board according to the first embodiment.
Figure 2:
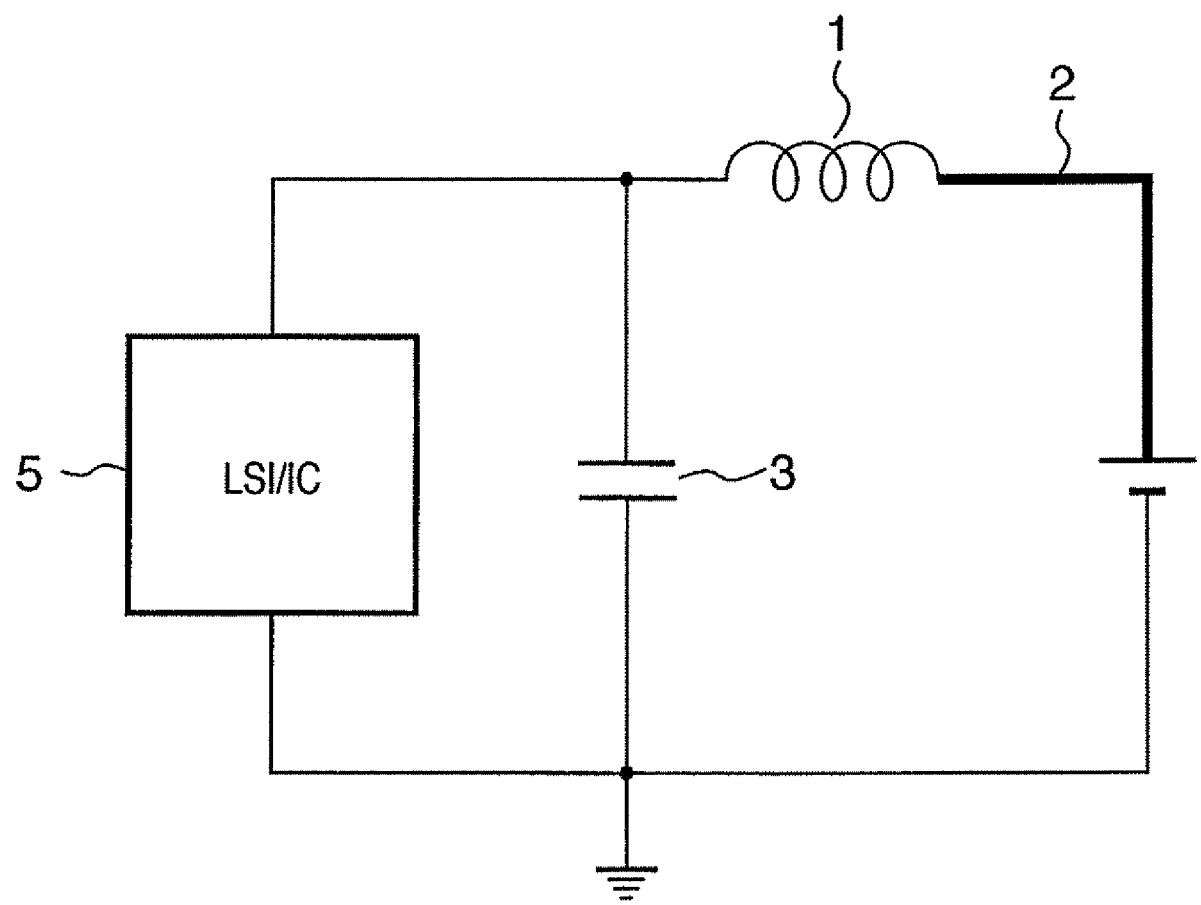
FIG. 2 is an equivalent circuit diagram of the print circuit board.
Figure 3:
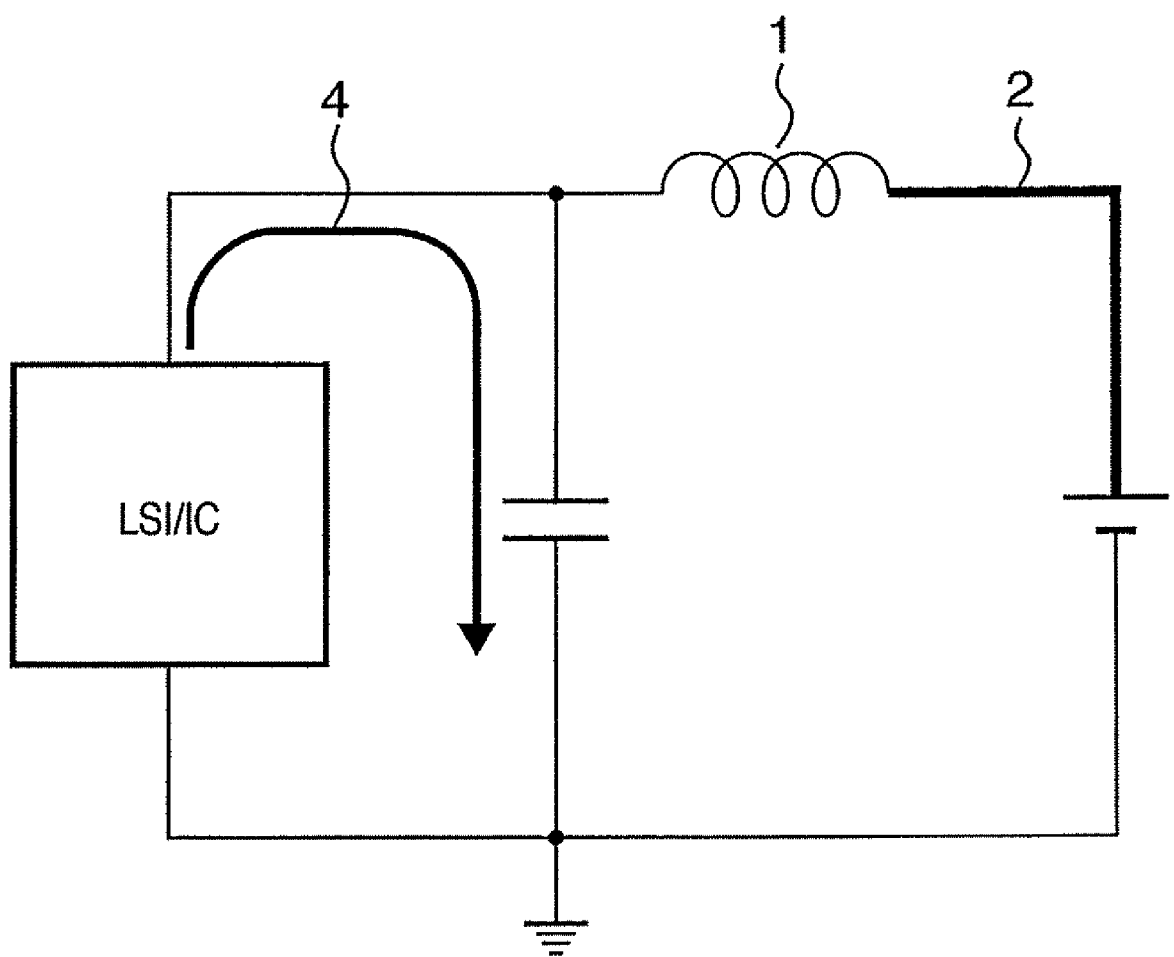
FIG. 3 is a view showing the flow of noise in the circuit in FIG. 2.
Figure 4:
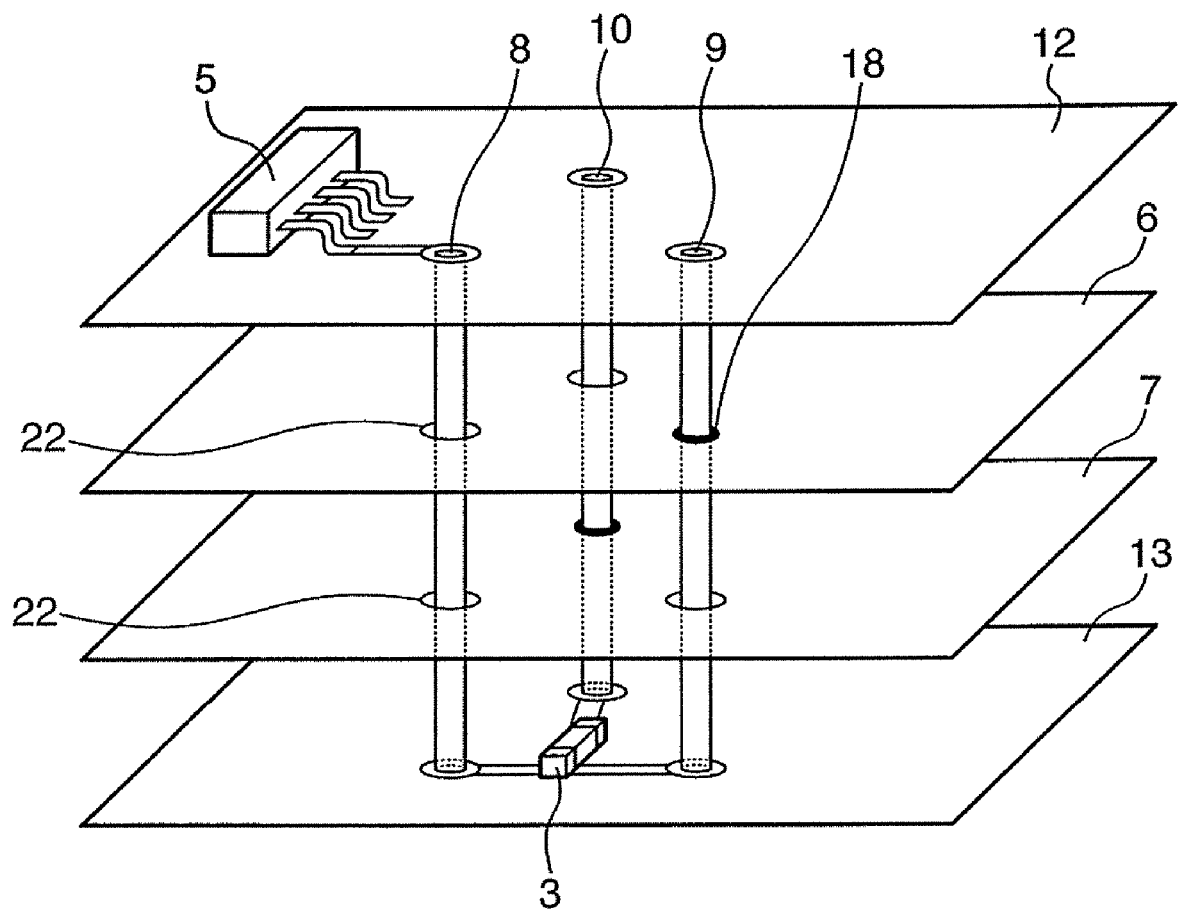
FIG. 4 is a perspective view schematically showing a conventional multilayer print circuit board.
Figure 5:
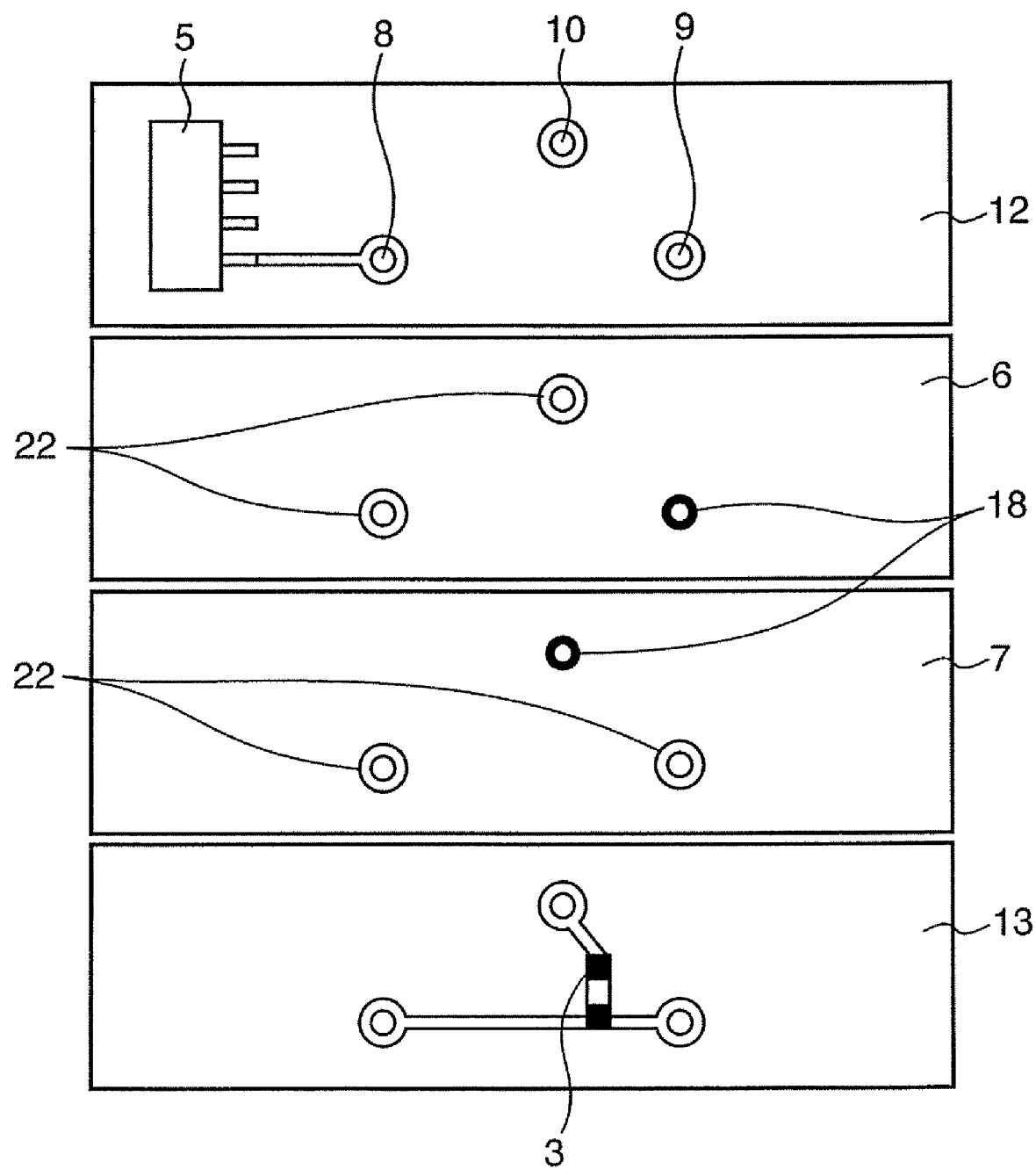
FIG. 5 is a plan view of the respective layers of the print circuit board in FIG. 4.
Figure 6:
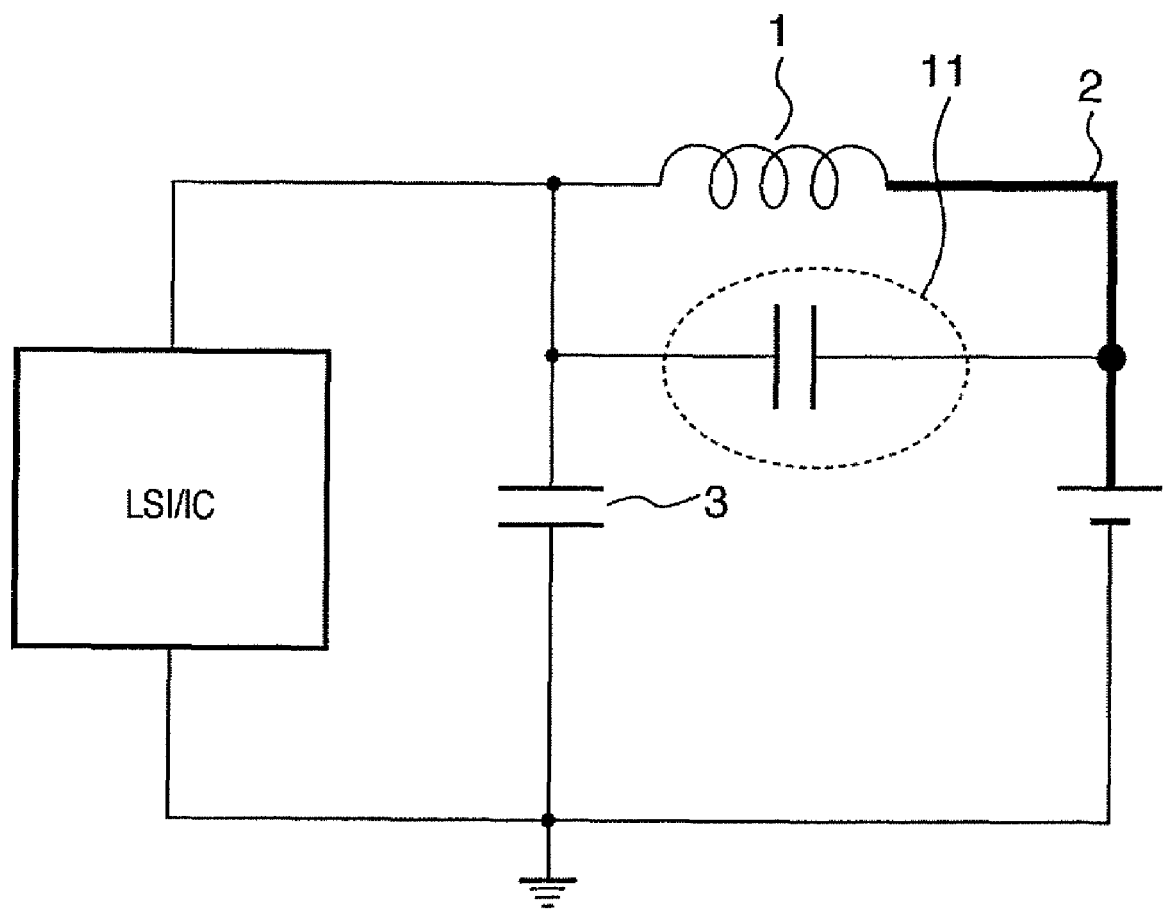
FIG. 6 is a circuit diagram showing capacitive coupling which is a problem in the prior art.
Figure 7:
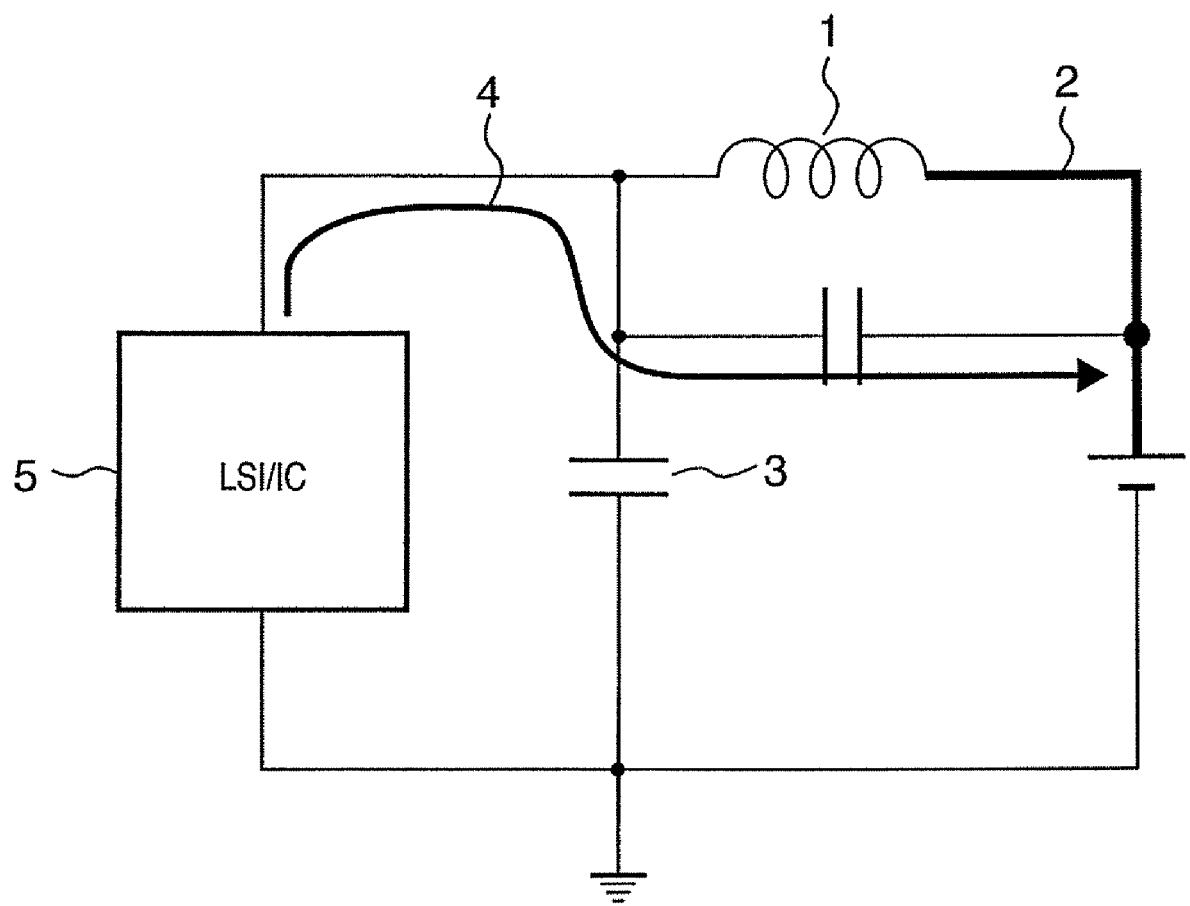
FIG. 7 is a view showing the flow of noise of the circuit in FIG. 6.

FIG. 1 is a perspective view schematically showing a multilayer print circuit board according to the first embodiment.

Referring to FIG. 1, reference numeral 5 denotes a semiconductor device such as an IC or LSI, which is arranged on a first surface layer 12. A wiring pattern 12a extends from a power supply terminal 21 of the semiconductor device 5 and connects to a first power supply via hole 8. The first power supply via hole 8 extends to a second surface layer 13 and connects to a power supply terminal 15 of a bypass capacitor 3 on a second surface layer 13 through a wiring pattern 14.

The first power supply via hole 8 extends through a main power supply layer 6 and ground layer 7 formed as inner layers. The main power supply layer 6 and ground layer 7 respectively have clearance holes (portions where no conductors are present) 17 and 22 to prevent short-circuiting.

The power supply terminal 15 of the bypass capacitor 3 connects to a second power supply via hole 9 through a wiring pattern 23. That portion of the ground layer 7 where the second power supply via hole 9 extends forms a clearance hole 22. The second power supply via hole 9 electrically connects to the main power supply layer 6 through a connecting portion 18.

That terminal of the bypass capacitor 3 which does not connect to the wiring pattern 14, i.e., a ground terminal 16, connects to a ground via hole 10 through a wiring pattern 24. That portion of the main power supply layer 6 where the ground via hole 10 extends forms another clearance hole 22. The ground via hole 10 electrically connects to the ground layer 7 through another connecting portion 18.

Figure 9:
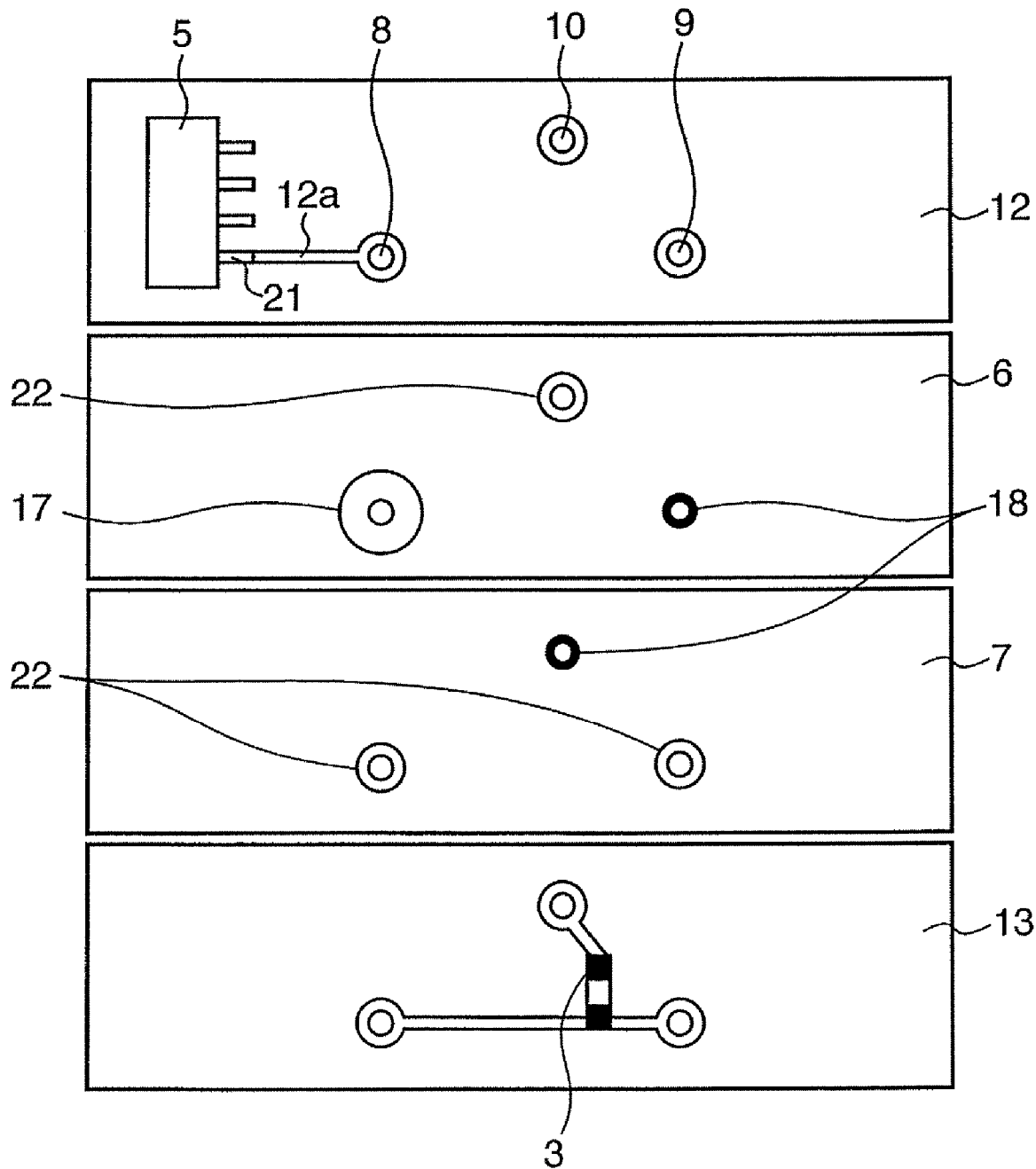
FIG. 9 is a schematic view seen from above of the respective layers of the multilayer print circuit board according to the first embodiment.

The print circuit board according to this embodiment exemplifies a four-layer substrate in which the first surface layer 12, main power supply layer 6, ground layer 7, and second surface layer 13 are arranged in the order named. FIG. 9 is a plan view of the respective layers.

The size of the clearance hole 22 at a portion where the first power supply via hole 8 extends through the ground layer 7 has a minimal value that the manufacture allows. This is due to the following reasons. As the bypass capacitor 3 is aimed at returning the noise to the ground layer 7, even if the capacitive coupling between the ground layer 7 and first power supply via hole 8 is strong, it does not pose any problem. Also, the allowable smallest clearance hole 22 makes it easy to maintain the continuity of the conductor in the ground layer 7.

The size of the clearance hole 17 at a portion where the first power supply via hole 8 extends through the main power supply layer 6 is larger than that of the clearance hole 22 in the ground layer 7. This is aimed at decreasing the capacitive coupling generated between the first power supply via hole 8 and main power supply layer 6 on the path to the bypass capacitor 3, to prevent outflow of the noise from the first power supply via hole 8 to the main power supply layer 6.

Figure 8:
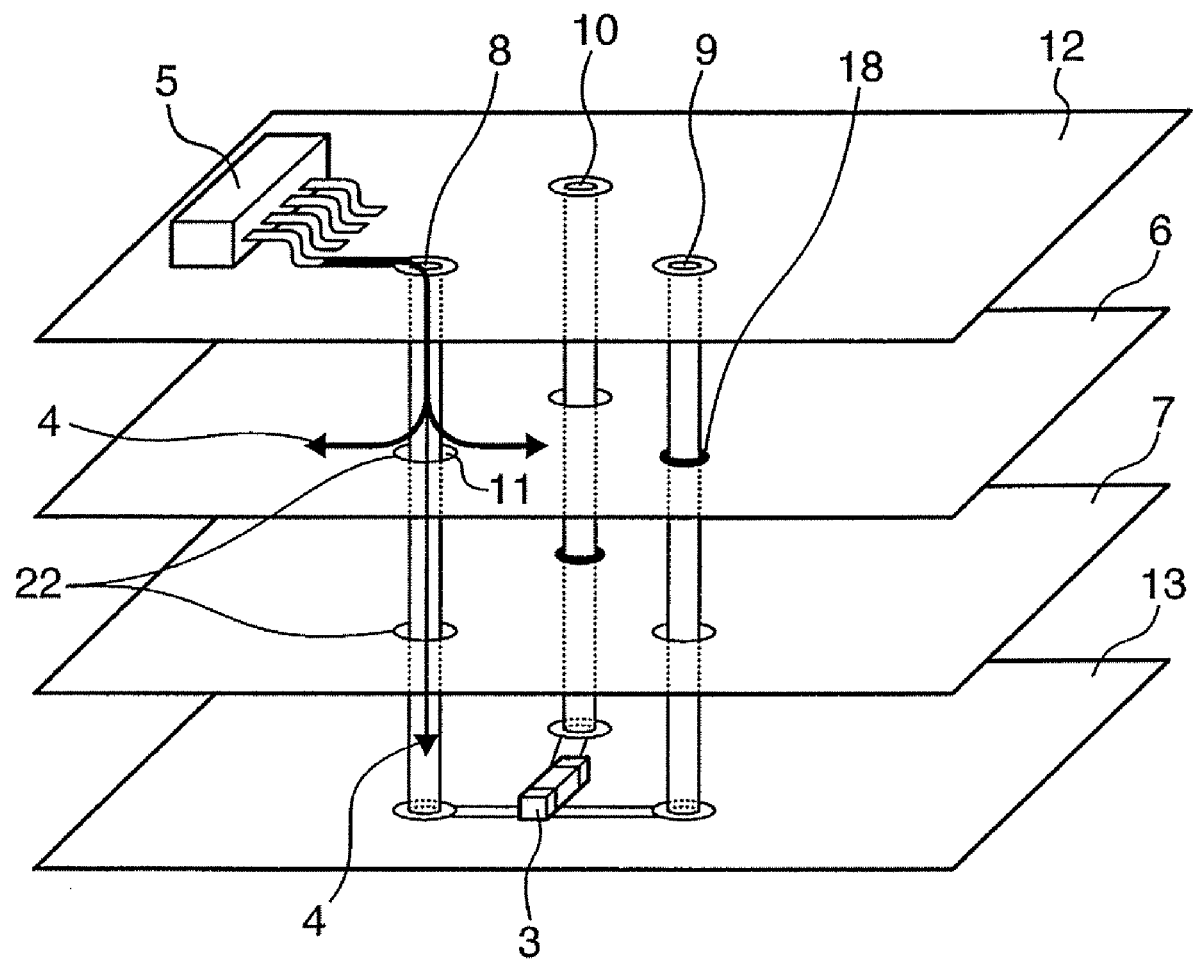
FIG. 8 is a view showing the flow of noise in FIG. 4.
Figure 10:
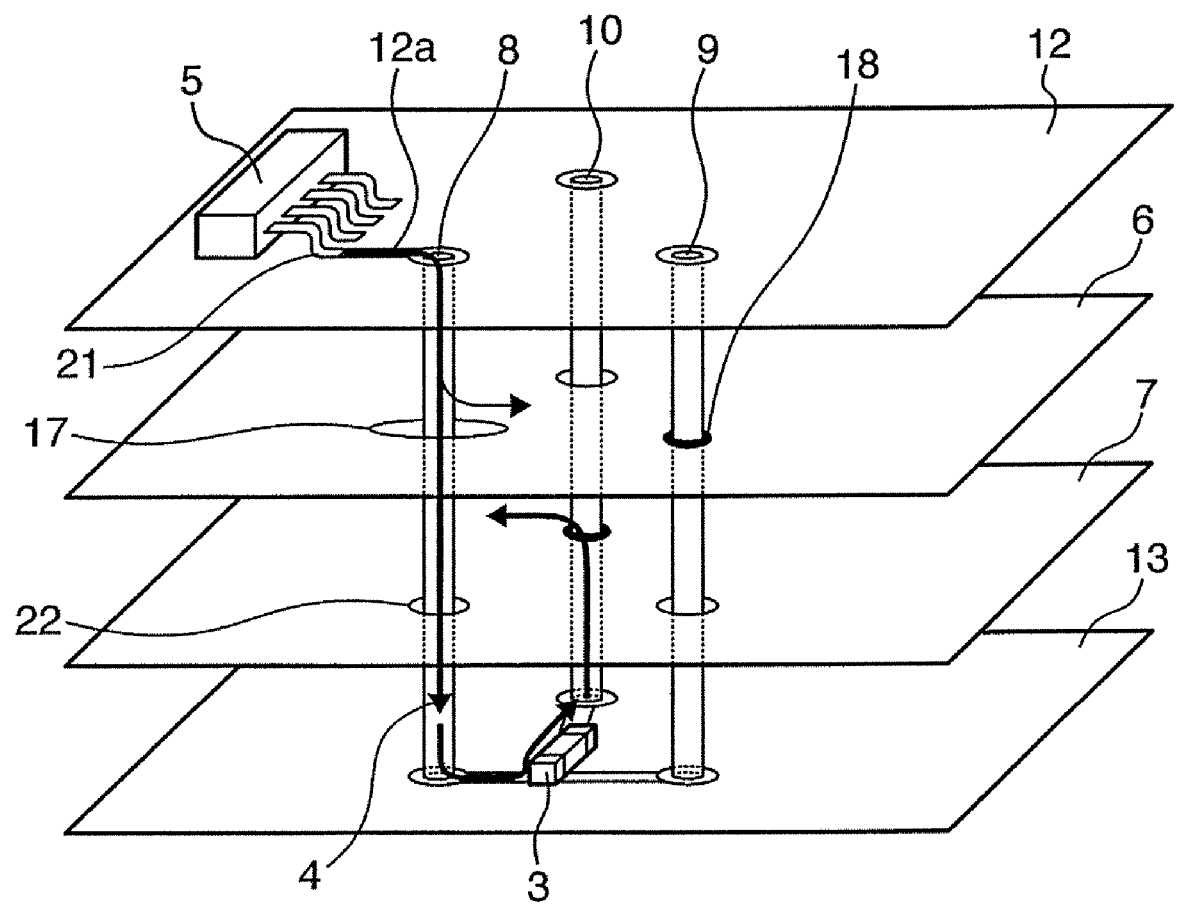
FIG. 10 is a view showing the flow of noise of the print circuit board in FIG. 1.

FIG. 10 schematically shows the flow of noise 4 in this embodiment. Referring to FIG. 10, when the clearance hole 17 at a portion where the first power supply via hole 8 extends through the main power supply layer 6 is large, outflow of the noise to the main power supply layer 6 is prevented more than in the prior art shown in FIG. 8.

Second Embodiment

Figure 11:
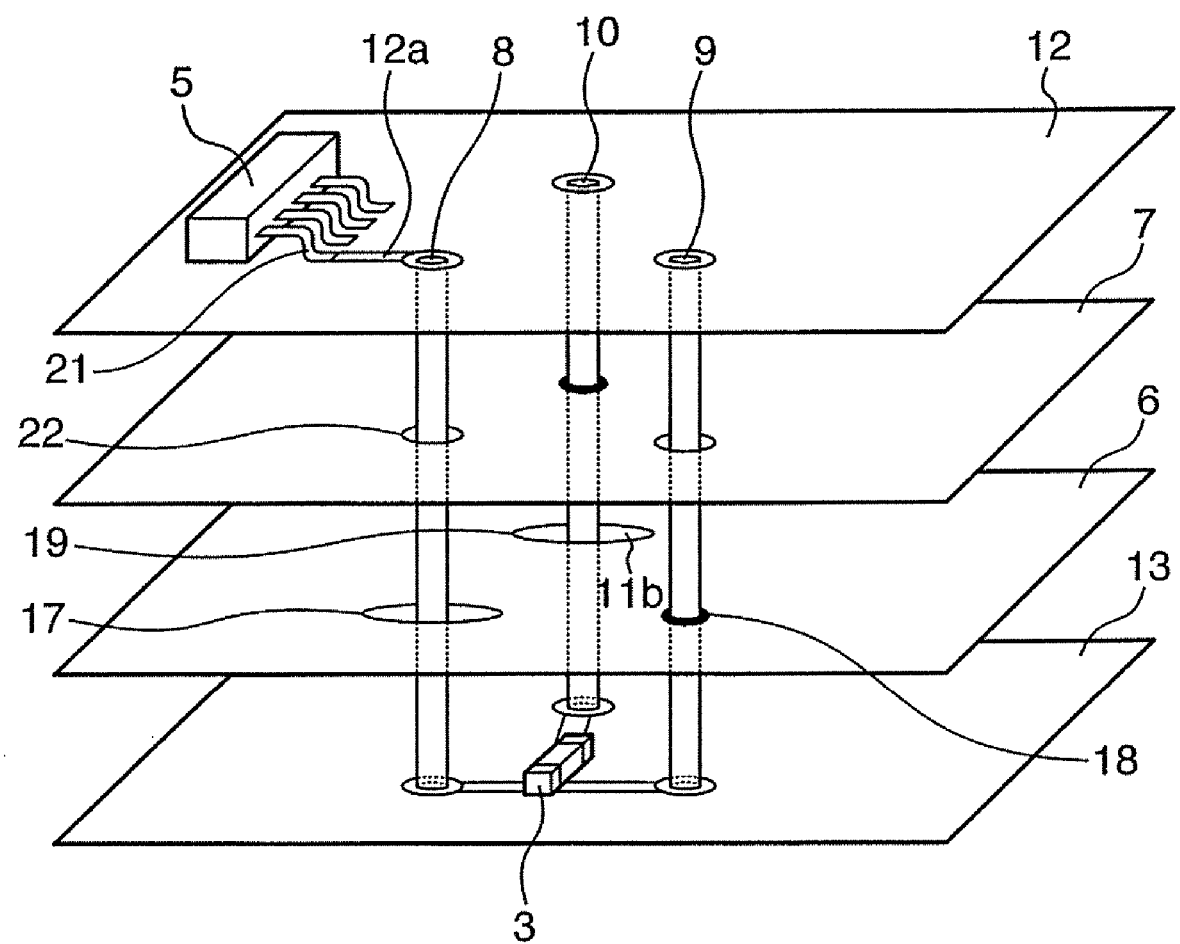
FIG. 11 is a perspective view schematically showing a multilayer print circuit board according to the second embodiment.

FIG. 11 is a perspective view schematically showing a multilayer print circuit board according to the second embodiment.

The second embodiment is different from the first embodiment in the order of a main power supply layer 6 and ground layer 7 as inner layers. A clearance hole 17 formed at a portion where a first power supply via hole 8 extends through the main power supply layer 6 has a large size, as in the first embodiment. In addition, a clearance hole 19 formed at a portion where a ground via hole 10 extends through the main power supply layer 6 also has a large size.

Figure 12:
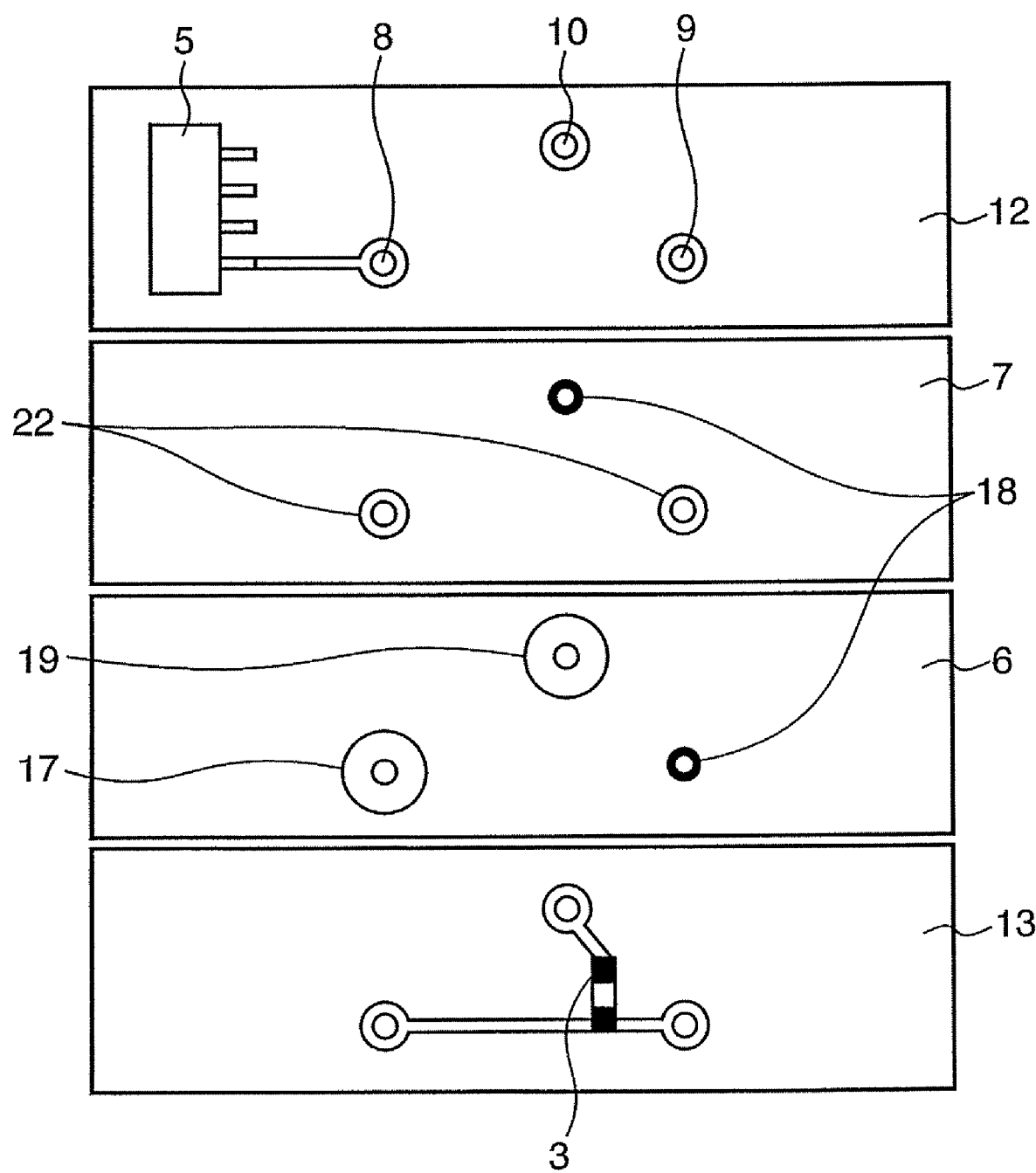
FIG. 12 is a schematic view seen from above of the respective layers of the multilayer print circuit board according to the second embodiment.

FIG. 12 is a schematic view, seen from above, of the respective layers of the multilayer print circuit board according to the second embodiment.

Figure 13:
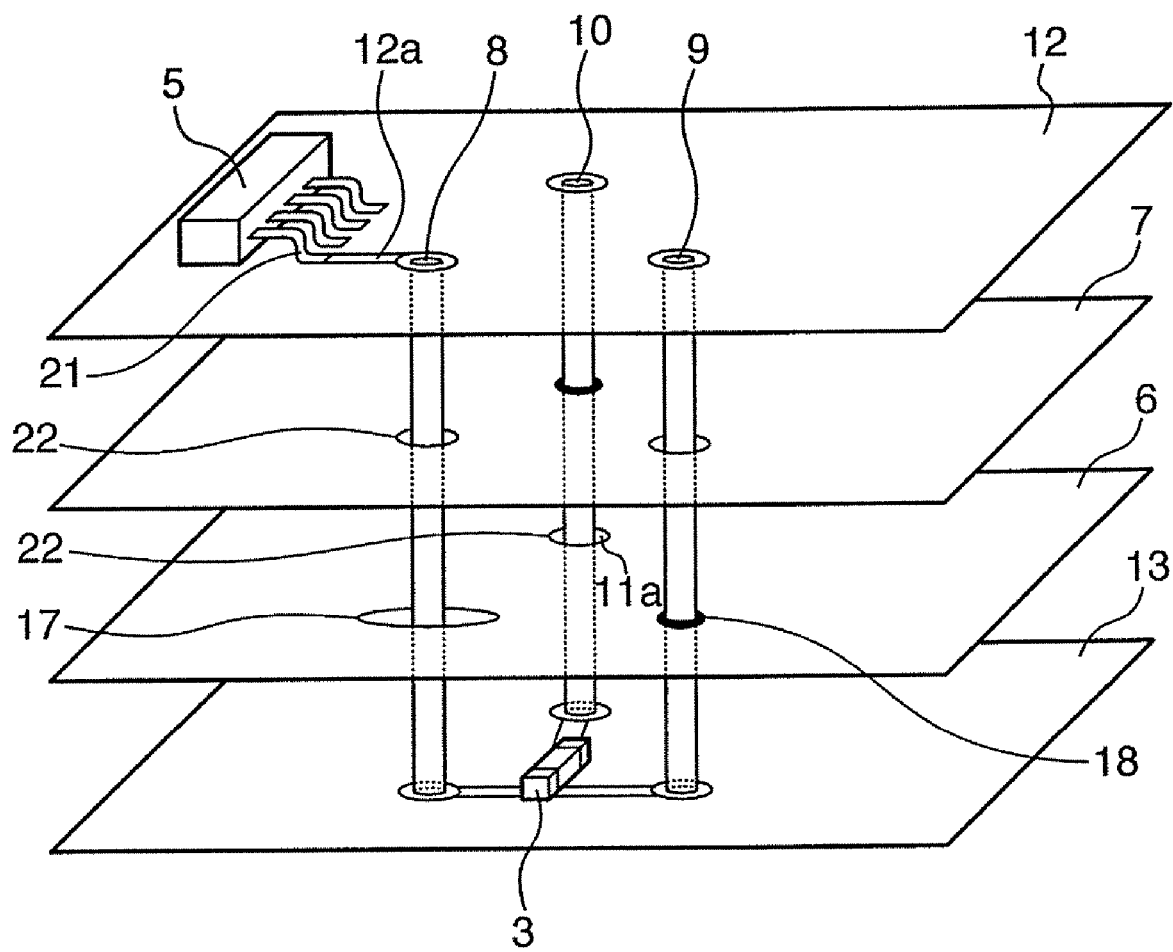
FIG. 13 is a perspective view schematically showing a printed circuit board which does not adopt the second embodiment.

FIG. 13 shows a case that does not adopt the second embodiment.

A large clearance hole 17 is formed only at a portion where a first power supply via hole 8 extends through a main power supply layer 6. This decreases capacitive coupling between the first power supply via hole 8 and main power supply layer 6, thus preventing noise outflow.

Figure 14:
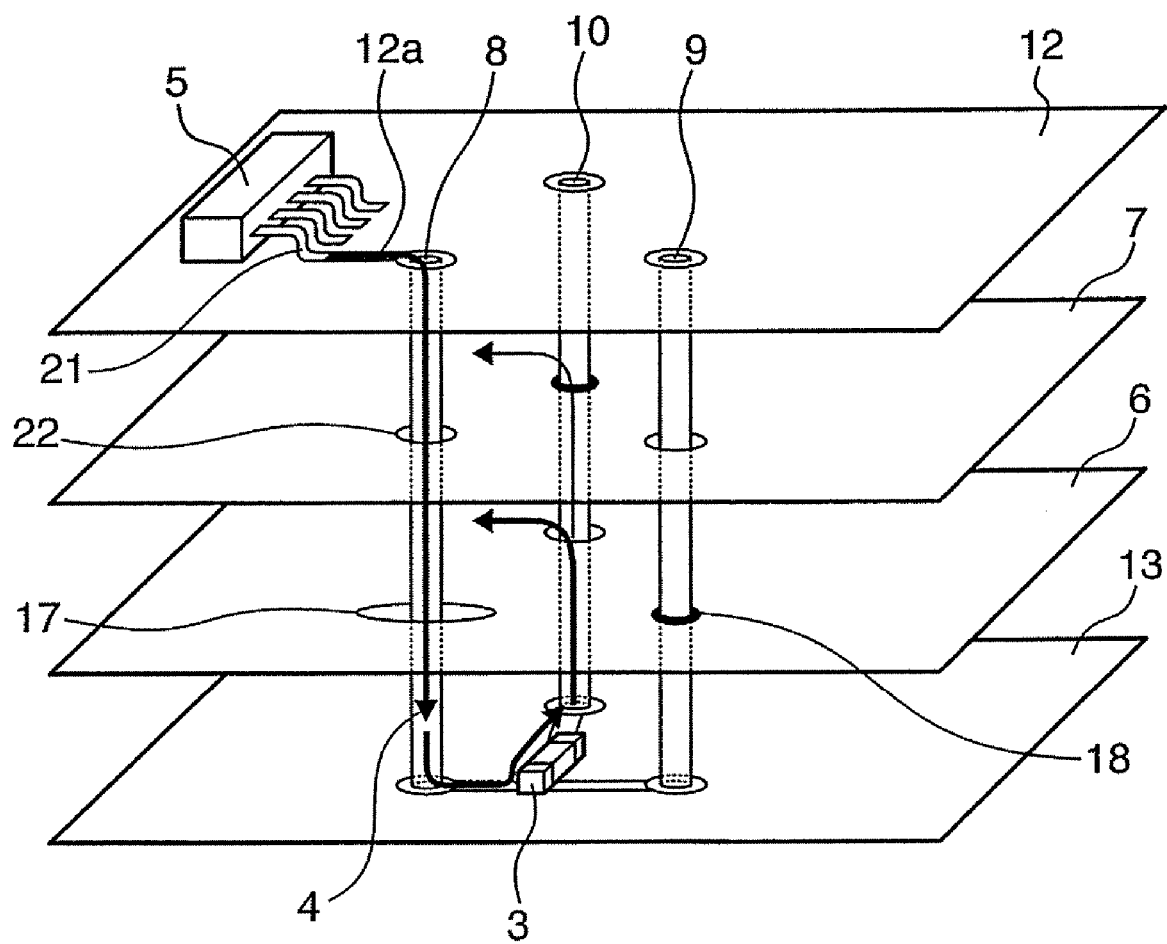
FIG. 14 is a view showing the flow of noise in FIG. 13.

When, however, noise passing through a bypass capacitor 3 flows into a ground via hole 10, capacitive coupling 11a between the ground via hole 10 and that portion of the main power supply layer 6 through which the ground via hole 10 extends undesirably causes the noise to flow out to the main power supply layer 6. FIG. 14 shows the flow of noise 4.

In view of this, according to this embodiment, as shown in FIGS. 11 and 12, the size of the clearance hole 19 at the portion where the ground via hole 10 extends through the main power supply layer 6 is also made large to decrease capacitive coupling 11b. This can prevent outflow of the noise from the ground via hole 10 to the main power supply layer 6.

Figure 15:
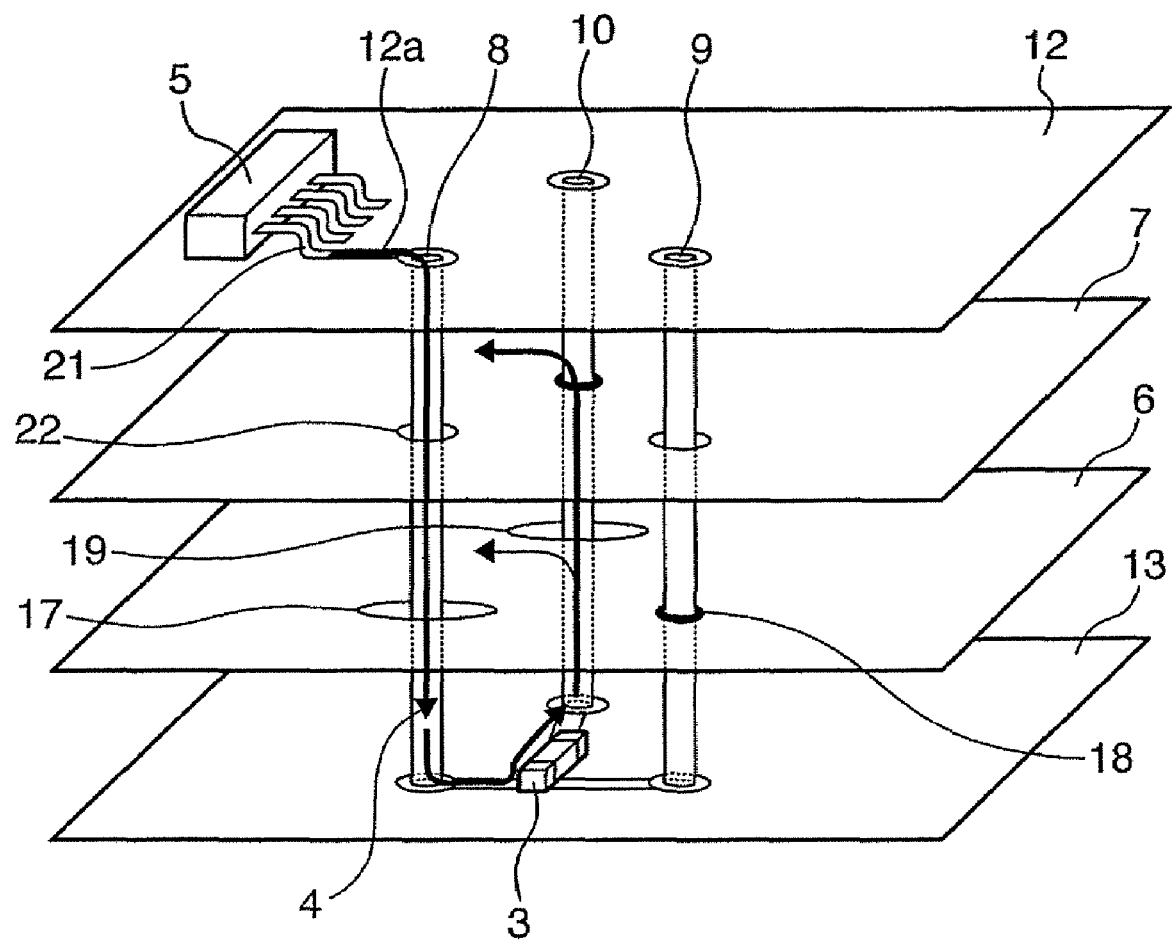
FIG. 15 is a view showing the flow of noise in FIG. 11.

FIG. 15 is a view showing the flow of the noise 4 according to the second embodiment.

As described above, the clearance holes 17 and 19 at portions where the first power supply via hole 8 and ground via hole 10 respectively extend through the main power supply layer 6 are made large to prevent the noise from flowing out to the main power supply layer 6.

Third Embodiment

Figure 16:
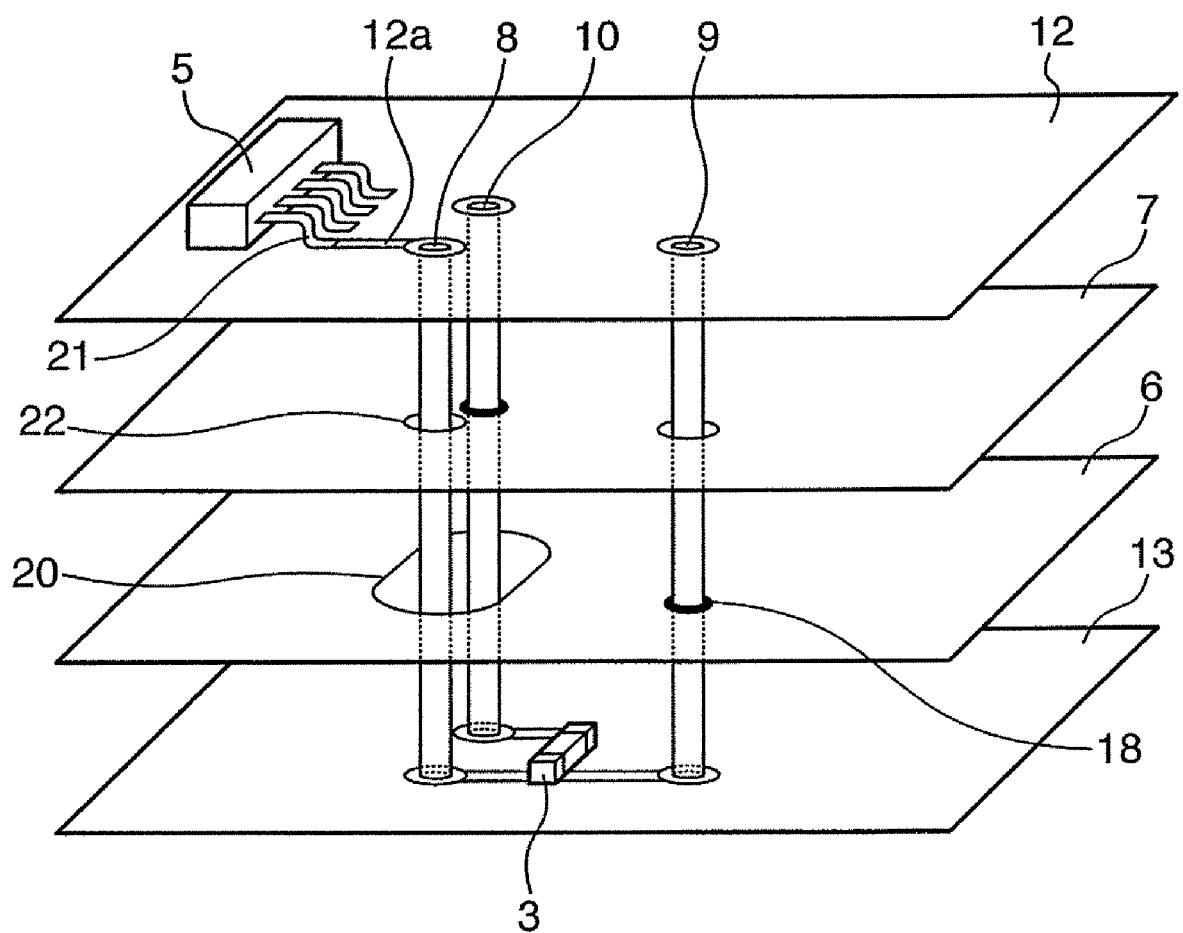
FIG. 16 is a perspective view schematically showing a multilayer print circuit board according to the third embodiment.

FIG. 16 is a perspective view schematically showing a multilayer print circuit board according to the third embodiment.

According to the third embodiment, a first power supply via hole 8 and ground via hole 10 are close to each other. A clearance hole 20 at a portion where the first power supply via hole 8 and ground via hole 10 extend through a main power supply layer 6 has a large size and forms one continuous clearance hole.

Figure 17:
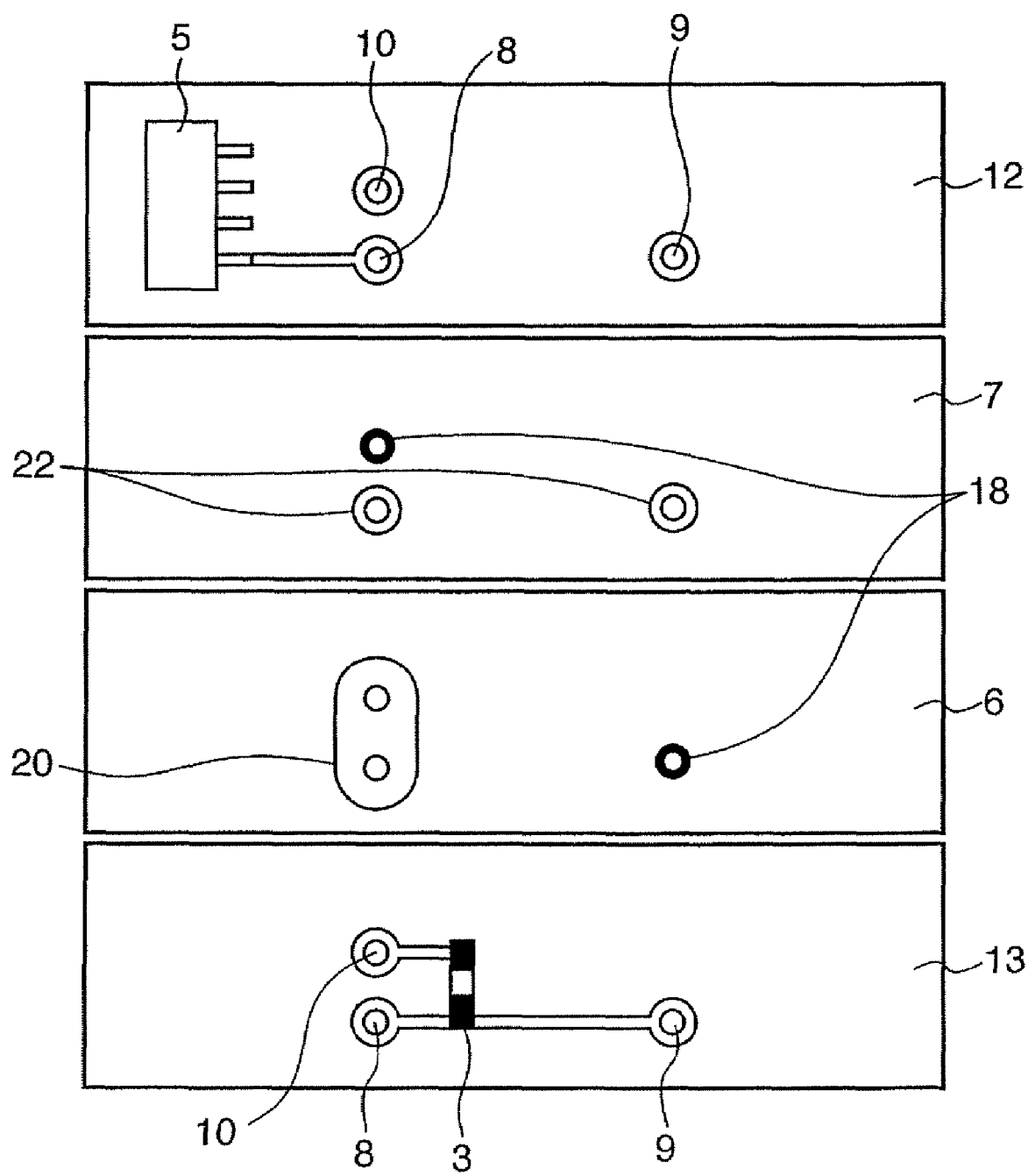
FIG. 17 is a schematic view seen from above of the respective layers of the multilayer print circuit board according to the third embodiment.

FIG. 17 is a schematic view seen from above of the respective layers of the multilayer print circuit board according to the third embodiment.

In this manner, when the clearance hole is made large, it decreases the capacitive coupling between the clearance hole and the main power supply layer 6 to prevent noise outflow to the main power supply layer 6. In addition, the first power supply via hole 8 and ground via hole 10 are arranged close to each other to enhance the capacitive coupling between the first power supply via hole 8 and ground via hole 10, so the via holes 8 and 10 exhibit the effect of a bypass capacitor. This consequently provides a larger decoupling effect.

Fourth Embodiment

Figure 18:
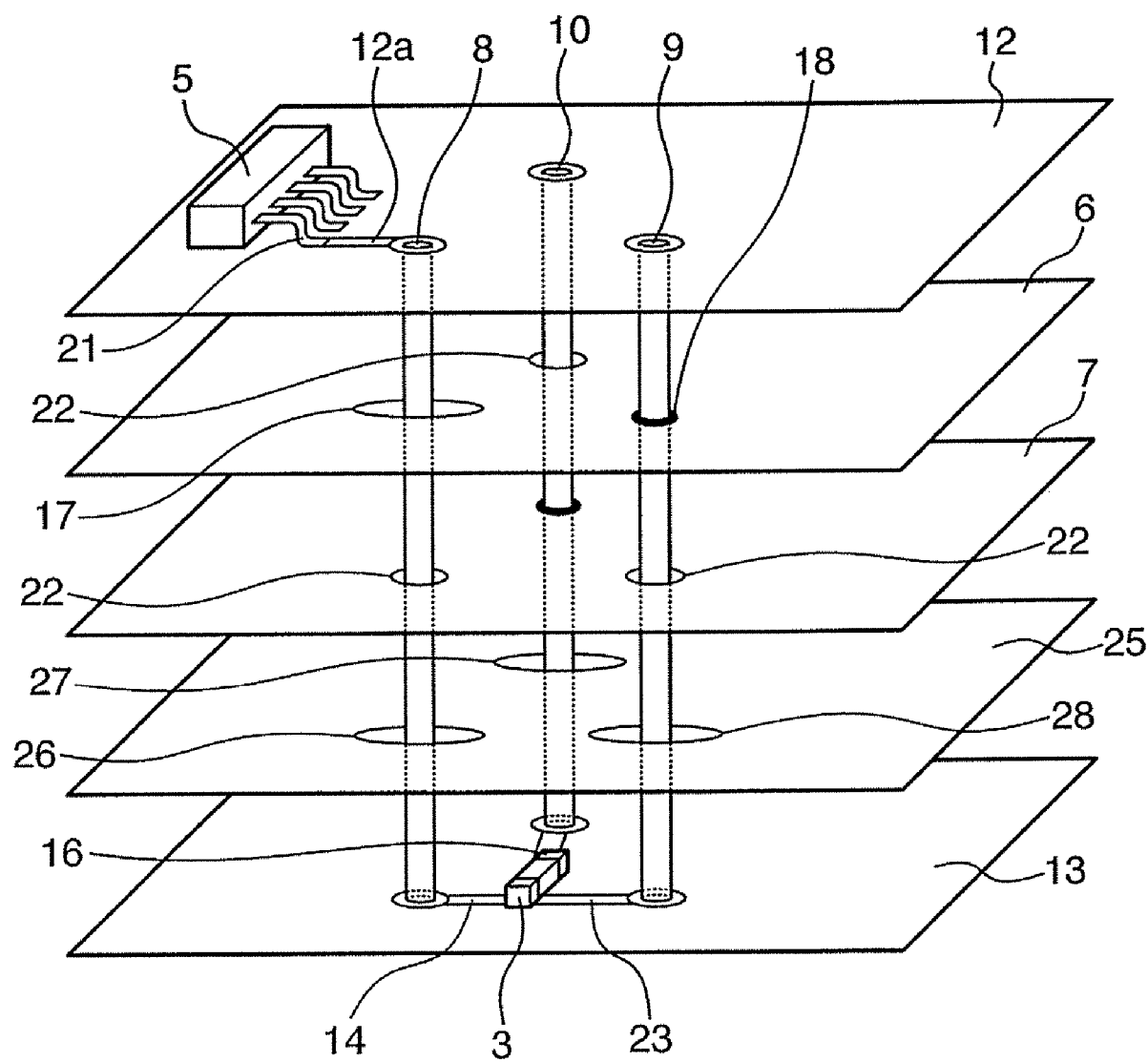
FIG. 18 is a perspective view schematically showing a multilayer print circuit board according to the fourth embodiment.

FIG. 18 is a perspective view schematically showing a multilayer print circuit board according to the fourth embodiment.

In the fourth embodiment, a second power supply conductive layer 25 is added to the print circuit board of the first embodiment. Although other inner signal wiring layers are also present, they are not shown in FIG. 18 as their description is not necessary in the fourth embodiment.

In recent years, digital circuits employ many power supplies. Generally, different power supply voltages are supplied to a plurality of semiconductor devices. Noise outflow to a power supply conductive layer other than the main power supply layer degrades EMI of the entire print circuit board in the same manner as noise outflow to the main power supply layer.

The fourth embodiment has, in addition to a main power supply layer 6 which supplies power to a semiconductor device 5, the second power supply conductive layer 25 which is different from the main power supply layer 6. To prevent noise outflow to the second power supply conductive layer 25, a clearance hole 26 where a first power supply via hole 8 extends through the second power supply conductive layer 25 forms a large clearance hole. A clearance hole 27 where a ground via hole 10 extends through the second power supply conductive layer 25 also forms a large clearance hole. Similarly, a clearance hole 28 where a second power supply via hole 9 extends through the second power supply conductive layer 25 also forms a large clearance hole.

As described above, according to this embodiment, the second power supply conductive layer 25 has the large clearance holes to decrease the capacitive coupling between the power supply conductive layer 25 and each of the first power supply via hole 8, ground via hole 10, and second power supply via hole 9. This can prevent noise outflow to the second power supply conductive layer 25.

Fifth Embodiment

Figure 19:
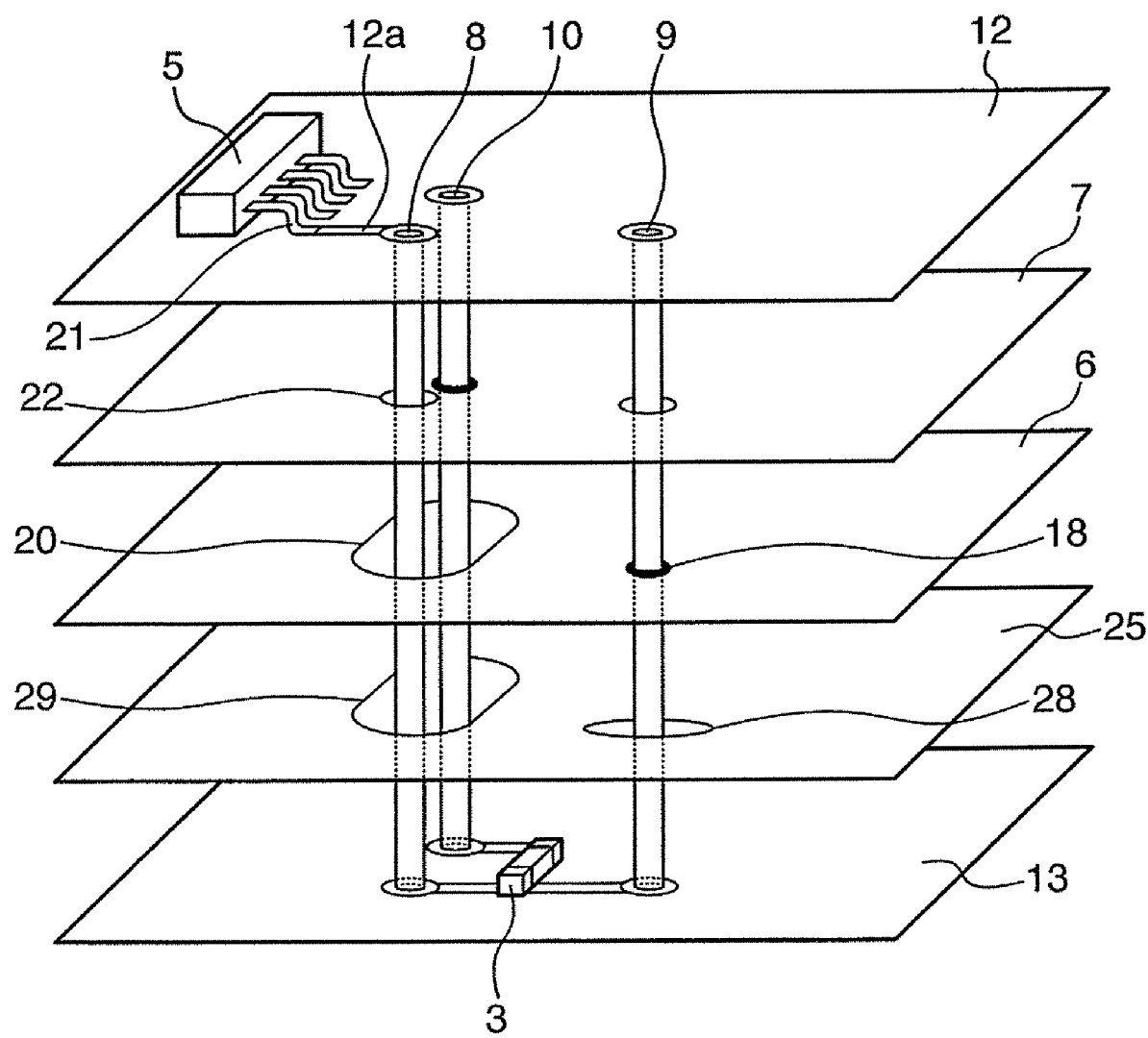
FIG. 19 is a perspective view schematically showing a multilayer print circuit board according to the fifth embodiment.

FIG. 19 is a perspective view schematically showing a multilayer print circuit board according to the fifth embodiment.

In the fifth embodiment, from the same reason as in the fourth embodiment, a second power supply conductive layer 25 is added to the print circuit board of the third embodiment. Although other inner signal wiring layers are also present, they are not shown in FIG. 19 as their description is not necessary in the fourth embodiment.

According to the fifth embodiment, a first power supply via hole 8 and ground via hole 10 are close to each other, in the same manner as in the third embodiment. A clearance hole 20 at a portion where the first power supply via hole 8 and ground via hole 10 extend through a main power supply layer 6 has a large size and forms one continuous clearance hole. Similarly, a clearance hole 29 at a portion where the first power supply via hole 8 and ground via hole 10 extend through the second power supply conductive layer 25 also has a large size and forms one continuous clearance hole.

In this manner, when the large clearance holes are formed, they decrease capacitive coupling between the first power supply via hole 8 and each of the main power supply layer 6 and second power supply conductive layer 25, to prevent noise outflow to the main power supply layer 6 and power supply conductive layer 25.

Furthermore, as the first power supply via hole 8 and ground via hole 10 are close to each other, the capacitive coupling between them increases. Then, the two via holes 8 and 10 exhibit the effect of a bypass capacitor to provide a large decoupling effect. Currents in opposite directions flow in the power supply via hole 8 and ground via hole 10. Thus, the proximity of the power supply via hole 8 and ground via hole 10 decreases transinductance. This achieves connection to the bypass capacitor with a lower impedance.

As has been described above, according to the first to fifth embodiments described above, in the multilayer print circuit board on which a semiconductor integrated circuit (IC) is mounted, the clearance hole at a portion where the power supply via hole, which connects the IC power supply terminal to the bypass capacitor, extends through the power supply layer is made large. This can readily prevent the noise current generated by the IC power supply terminal from flowing out to the power supply layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-358161, filed Dec. 12, 2005, which is hereby incorporated by reference herein in its entirety.

What is claimed is:

1. A multilayer print circuit board in which a semiconductor integrated circuit is mounted on a first surface layer and a bypass capacitor is mounted on a second surface layer on a side opposite to said first surface layer, and which has a power supply conductive layer and a ground conductive layer therein, comprising:
   a first power supply via hole which connects to a power supply terminal of said semiconductor integrated circuit on said first surface layer and extends from said first surface layer to said second surface layer;
   a power supply wiring which connects to said first power supply via hole on said second surface layer;
   a ground via hole which connects to said ground conductive layer, extends from said ground conductive layer to said second surface layer, and connects to said power supply wiring on said second surface layer through said bypass capacitor;
   a first clearance hole which is formed around a portion of said power supply conductive layer where said first power supply via hole extends, to eliminate any conductor so said first power supply via hole and said power supply conductive layer do not come into contact with each other; and
   a second clearance hole which is formed around a portion of said ground conductive layer where said first power supply via hole extends, to eliminate any conductor so said first power supply via hole and said ground conductive layer do not come into contact with each other,
   wherein said first clearance hole has a larger size than that of said second clearance hole.

2. The board according to claim 1, further comprising a second power supply via hole which connects to said power supply conductive layer, extends from said power supply conductive layer to said second surface layer, and connects to said power supply wiring on said second surface layer.

3. The board according to claim 1, wherein said second clearance hole includes a minimum manufacturable size.

4. The board according to claim 1, wherein said first power supply via and said ground via hole are arranged close to each other to locate in said first clearance hole.

5. The board according to claim 1, further comprising a third clearance hole which is formed without any conductor around a portion of said power supply conductive layer where said ground via hole extends so said ground via hole and said power supply conductive layer do not come into contact with each other, said third clearance hole being larger than said second clearance hole.

6. The board according to claim 1, further comprising a second power supply conductive layer which does not electrically connect to said power supply conductive layer, and a fourth clearance hole which is formed without any conductor around a portion of said second power supply conductive layer where said first power supply via hole extends so said first power supply via hole and said second power supply conductive layer do not come into contact with each other, said fourth clearance hole being larger than said second clearance hole.

7. The board according to claim 6, further comprising a fifth clearance hole which is formed without any conductor around a portion of said second power supply conductive layer where said ground via hole extends so said ground via hole and said second power supply conductive layer do not come into contact with each other, said fifth clearance hole being larger than said second clearance hole.

8. The board according to claim 7, further comprising a second power supply via hole which connects to said power supply conductive layer, extends from said power supply conductive layer to said second surface layer, and connects to said power supply wiring on said second surface layer, and a sixth clearance hole which is formed without any conductor around a portion of said second power supply conductive layer where said power supply via hole extends so said second power supply via hole and said second power supply conductive layer do not come into contact with each other, said sixth clearance hole being larger than said second clearance hole.

9. The board according to claim 6, wherein said first power supply via hole and said ground via hole are arranged close to each other to locate in said fourth clearance hole.

* * * * *